(12) United States Patent
Schwarzl et al.

(10) Patent No.: US 6,930,052 B2
(45) Date of Patent: Aug. 16, 2005

(54) METHOD FOR PRODUCING AN INTEGRATED CIRCUIT HAVING AT LEAST ONE METALICIZED SURFACE

(75) Inventors: Siegfried Schwarzl, Neubiberg (DE); Manfred Engelhardt, Feldkirchen-Westerham (DE); Franz Kreupl, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/654,054

(22) Filed: Sep. 3, 2003

(65) Prior Publication Data

US 2004/0092093 A1 May 13, 2004

Related U.S. Application Data

(63) Continuation of application No. 10/005,293, filed on Dec. 5, 2001, now abandoned.

(30) Foreign Application Priority Data

Aug. 25, 1999 (DE) .......................................... 199 40 358

(51) Int. Cl.$^7$ ............................................. H01L 21/308
(52) U.S. Cl. ....................... 438/738; 438/624; 438/634; 438/637; 438/700; 438/734
(58) Field of Search ................. 438/624, 634, 438/637, 700, 734, 737, 738

(56) References Cited

U.S. PATENT DOCUMENTS

| 5,143,820 | A |   | 9/1992 | Kotecha et al. |
| 5,821,169 | A |   | 10/1998 | Nguyen et al. |
| 6,153,511 | A | * | 11/2000 | Watatani ..................... 438/623 |
| 6,211,092 | B1 | * | 4/2001 | Tang et al. .................. 438/719 |
| 6,326,301 | B1 | * | 12/2001 | Venkatesan et al. ........ 438/638 |

FOREIGN PATENT DOCUMENTS

| DE | 19723062 | 1/1998 |
| EP | 0945900 | 9/1999 |
| WO | WO 99/33102 | 7/1999 |
| WO | WO 00/03432 | 1/2000 |
| WO | WO 00/59030 | 10/2000 |

OTHER PUBLICATIONS

P. Singer, Semiconductor International, Making the Move to Dual Damascene Processing, Aug. 1997, 3 pages.
K. Derbyshire, *Solid State Technology*, Feb. 1998, 6 pages.
R.L. Jackson, et al, Solid State Technology, Processing and integration of copper interconnects, Mar. 1998. 5 pages.
Y. Morand, et al, 1997 Symposium on VLSI Technology Digest of Technical Papers, Copper Integration in Self Aligned Dual Damascene Architecture, pp. 31–32.
Patent Abstracts of Japan, Publication No. 11162982, Application No. 09326678, Manufacture of Semiconductor Device, 1 page.

* cited by examiner

Primary Examiner—George Fourson
Assistant Examiner—Julio J. Maldonado
(74) Attorney, Agent, or Firm—Altera Law Group, LLC; Jeffrey R. Stone

(57) ABSTRACT

In order to fabricate a metallization plane with lines and contacts, four dielectric layers are applied to a substrate. Firstly, contact holes are etched through the top two dielectric layers into the underlying dielectric layer, the remaining thickness of the latter layer being essentially equal to the thickness of the top layer. Line trenches are subsequently etched selectively with respect to the first dielectric layer and the third dielectric layer, whose surfaces are uncovered essentially simultaneously. After the first dielectric layer and the third dielectric layer have been patterned, contacts and lines are produced in the contact holes and line trenches.

10 Claims, 2 Drawing Sheets

METHOD FOR PRODUCING AN INTEGRATED CIRCUIT HAVING AT LEAST ONE METALICIZED SURFACE

CROSS-REFERENCE TO RELATED APPLICATIONS

The present application is a continuation application of U.S. patent application Ser. No. 10/005,293, filed Dec. 5, 2001, now abandoned entitled METHOD FOR PRODUCING AN INTEGRATED CIRCUIT HAVING AT LEAST ONE METALICIZED SURFACE, naming Siegfried Schwartz, et al. as inventor and is incorporated by reference as if fully set forth herein.

FIELD OF THE INVENTION

This invention relates generally to metallization planes used in integrated circuits to connect active components.

BACKGROUND OF THE PRESENT INVENTION

Metallization planes are used in integrated circuits to connect active components. In this case, a metallization plane comprises lines and contacts via which the lines are connected to conductive structures. Said contacts are often referred to as vias by experts. Said conductive structures may be diffusion regions, terminal electrodes, metal contacts or lines of metallization planes arranged below the respective metallization plane. If a plurality of metallization planes arranged one above the other are provided in an integrated circuit, then this is referred to as multilayer metallization.

DESCRIPTION OF THE RELATED ART

Metallization planes are increasingly being fabricated according to the so-called damascene technique.

In the damascene technique, firstly a dielectric is deposited which surrounds the lines and contacts that are to be fabricated later. Holes and trenches are formed in the intermetal dielectric and are subsequently filled with metal. This produces contacts, also called vias, in the holes and the lines in the trenches. The process of filling with metal is effected by PVD, CVD or electroplating and subsequent chemical mechanical polishing. This method is employed in particular if the metallization plane is formed from a metal which is difficult to etch.

The term dual damascene expresses the fact that firstly the contact holes and trenches are patterned and these are filled jointly by the deposition of metal and chemical mechanical polishing.

P. Singer, Semiconductor International, August 1997, page 79, K. Derbyshire, Solid State Technology, February 1998, page 26, R. L. Jackson et al., Solid State Technology, March 1998, page 49 and Y. Morand et al., 1997 Symp. On VLSI Techn. Digest of Technical Papers, 31 disclose various process variants for a dual damascene process.

It has been proposed (see P. Singer, Semiconductor International, August 1997, page 79) firstly to etch the trenches for the lines and then to produce the deeper contact holes. In this case, a photoresist mask that is used during the contact hole etching has to be patterned photolithographically on the uneven foundation resulting from the trench etching. In this case, problems arise, in particular in the case of deep contact holes, as a result of resist that has not been fully exposed, unresolved hole structures or hole widening in the event of overexposure.

As an alternative, it has been proposed (see P. Singer, Semiconductor International, August 1997, page 79) firstly to carry out the contact hole etching and then to carry out the trench etching for the lines. During the contact hole etching, there is the risk of the surface of the conductive structure, which may be, in particular, a copper interconnect, being uncovered and contaminants being applied to the walls of the contact hole. In order to avoid this, use is usually made of an etching layer made of silicon nitride, on the surface of which a silicon oxide layer is arranged in which the contact hole and the trenches are etched. However, in many etching processes the etching selectivity is limited for example by the oxygen liberated during the $SiO_2$ etching, so that the underlying surface is nonetheless uncovered.

In order to eliminate this problem, it has been proposed to protect the contact hole during the trench etching by means of a photoresist plug. However, it has been found that cavity-free filling of the contact hole with photoresist is not possible in a reproducible manner and that, moreover, the residue-free removal of photoresist from the contact holes leads to further problems.

As an alternative it has been proposed (see P. Singer, Semiconductor International, August 1997, page 79 and Y. Morand et al., 1997 Symp. On VLSI Techn. Digest of Technical Papers, 31), to produce as the intermetal dielectric a layer sequence comprising a first silicon nitride layer, an $SiO_2$ layer and a second silicon nitride layer. Firstly, the upper second silicon nitride layer is patterned, using a contact hole mask. After the contact hole mask has been removed, a second $SiO_2$ layer is applied. Then, using a line mask, firstly the trenches are etched and afterwards, selectively with respect to silicon nitride, the contact holes, down to the lower first silicon nitride layer. During this etching process, the patterned upper silicon nitride layer acts as an additional mask. The problem of reduced selectivity on account of the oxygen liberated during the $SiO_2$ etching occurs in this case, too.

U.S. Pat. No. 6,211,092 B1 to Tang et al., discloses following processing method:

1. Use of a four layer stack of four dielectric layers;
2. Application of a first structured mask having a first opening corresponding to the arrangement of a contact hole above the four layer stack;
3. Timed non-selectively etching the second, third and fourth dielectric layers below the first opening of the first structured mask to form a hole;
4. Selectively etching the second dielectric layer until the surface of the first dielectric layer is uncovered. Thus, the hole is formed by only using the first structured mask;
5. Removing the first structured mask;
6. Applying a second structured mask having a second opening corresponding to the arrangement of a line trench above the four layer stack and aligned to the hole;
7. Selectively etching the fourth dielectric layer below the second opening of the second structured mask to form the line trench until the surface of the third dielectric layer is uncovered, thereby forming a contact hole;
8. Selectively etching the first and third dielectric layers at the bottom of the contact hole and of the line trench until the underlying surface is uncovered.

Thus, Tang only discloses formation of the hole, from which the contact hole results, during a non-selective/selective etching process using only a first etching mask. It is only after the formation of the hole is complete, i.e., the uncovering of the first dielectric layer, that the line trench is formed during an etching using a second etching mask. The etching using the second mask is performed exclusively using a selective etching process.

In contrast, the present invention does not teach etching into the fourth and second dielectric layer using the second etching mask. Further, under the present invention, the etching into the fourth and the second dielectric layer is partially carried out using a non-selective process in contrast to Tang which uses selective etching exclusively. Tang also fails, in contrast with the present invention, to disclose a step wherein the ending of the first non-selective etching in the inventive method is "adjusted" depending upon the relative thicknesses of the second and fourth layers. Finally, Tang discloses the use of selective together with non-selective etching in connection with the first etching mask, while the present invention uses only non-selective etching.

U.S. Pat. No. 6,153,511 to Watatani discloses the following processing method:

1. Using a six layer stack of six dielectric layers;

2. Applying a first structured mask with a first opening corresponding to the arrangement of a line trench above the stack;

3. Selectively etching the sixth dielectric layer below the opening of the first structured mask to form a hole until the $5^{th}$ dielectric layer is uncovered;

4. Removing the first mask;

5. Applying a second mask having a second opening that corresponds to the arrangement of a contact hole above the stack and aligned to the hole;

6. Selectively etching the $5^{th}$ dielectric layer below the second opening of the second mask until the 4th dielectric layer is uncovered;

7. Removing the second mask;

8. Selectively etching the $3^{rd}$ and $5^{th}$ dielectric layers below the hole formed in the $6^{th}$ dielectric layer until the surfaces of the $2^{nd}$ and $4^{th}$ dielectric layers are uncovered, wherein the $6^{th}$ dielectric layer functions as a hard mask;

9. Selectively etching the $2^{nd}$ and $4^{th}$ dielectric layers below the hole formed in the $6^{th}$ layer until the surfaces of the $1^{st}$ and $3^{rd}$ layers are uncovered, wherein the $3^{rd}$, $5^{th}$ and $6^{th}$ layers function as hard masks; and 10. Selectively etching the $1^{st}$ and $3^{rd}$ layers below the hole formed in the $6^{th}$ layer until the $1^{st}$ layer is uncovered, wherein the $2^{nd}$, $4^{th}$, $5^{th}$ and $6^{th}$ layers function as a hard mask.

Thus, in contrast to the present invention, Watatani discloses formation of the contact hole and line trench only during selective etching processes. As a result, formation of contact holes and line trenches using Watatani require much more time than the method disclosed in either Tang, which also discloses only selective etching processes in connection with the $2^{nd}$ mask, than in the present invention.

The invention is based on the problem of specifying a method for fabricating an integrated circuit having at least one metallization plane which is suitable for fabricating metallization planes with metals that are difficult to etch and in which contaminants are avoided. This problem is solved by means of a method in accordance with claim 1. Further refinements of the invention emerge from the rest of the claims.

The present invention accomplishes these goals.

SUMMARY OF THE INVENTION

In the method, a first dielectric layer, a second dielectric layer, a third dielectric layer and a fourth dielectric layer are applied on a surface of a substrate. In this case, the first dielectric layer and the third dielectric layer, and the second dielectric layer and the fourth dielectric layer, in each case have the same etching properties. The thickness of the second dielectric layer differs from the thickness of the fourth dielectric layer.

If the thickness of the second dielectric layer is greater than the thickness of the fourth dielectric layer then, using a first etching mask, which defines the arrangement of contact holes, etching is effected through the fourth dielectric layer and the third dielectric layer into the second dielectric layer. In this case, etching is effected into the second dielectric layer to a depth such that the remaining thickness of the second dielectric layer is essentially equal to the thickness of the fourth dielectric layer.

Using a second etching mask, which defines the arrangement of line trenches, firstly the fourth dielectric layer and, at the same time, the second dielectric layer are etched incompletely using a non-selective process, i.e. the etching is ended before the surface of the underlying layer is uncovered. Then, selectively, with respect to the third dielectric layer and with respect to the first dielectric layer, uncovered parts of the fourth dielectric layer and of the second dielectric layer are etched until the underlying surface is uncovered in each case. The surface of the third dielectric layer is uncovered, in the case of the fourth dielectric layer, and the surface of the first dielectric layer is uncovered in the case of the second dielectric layer.

Preferably, after the formation of the second etching mask, firstly a non-selective etching method which is optimized with regard to a high etching rate is used to etch into uncovered parts of the fourth dielectric layer and of the second dielectric layer. The etching is ended before the underlying surfaces are uncovered. In this way, the layer thickness that has to be etched using a selective etching process, which usually has very low etching rates, is reduced. The duration of the fabrication process is thus shortened.

Afterwards, the third dielectric layer and the first dielectric layer are etched until the underlying surface is uncovered in each case. The surface of the second dielectric layer is uncovered under the third dielectric layer and the surface of the substrate is uncovered under the first dielectric layer. After this etching, the contact holes and the line trenches are completed.

If the thickness of the fourth dielectric layer is greater than the thickness of the second dielectric layer, then, using the first etching mask, which defines the arrangement of contact holes, etching is effected into the fourth dielectric layer. In this case, etching is effected into the fourth dielectric layer to a depth such that the remaining thickness of the fourth dielectric layer is essentially equal to the thickness of the second dielectric layer.

A non-selective etching process is then carried out using the second etching mask, which defines the arrangement of line trenches. As a result of the preceding etching using the first etching mask, the fourth dielectric layer has depressions at the locations of the contact holes. By employing the non-selective etching process, which etches the fourth dielectric layer, the third dielectric layer and the second dielectric layer at essentially the same etching rate, at the locations of the contact holes, etching is effected through the fourth dielectric layer and the third dielectric layer into the second dielectric layer. At the same time, etching is effected into the fourth layer at the locations of the line trenches outside the contact holes. Afterwards, uncovered parts of the fourth dielectric layer and of the second dielectric layer are etched selectively with respect to the third dielectric layer and with respect to the first dielectric layer until the underlying surface of the third dielectric layer and of the first dielectric layer, respectively, is uncovered.

Afterwards, the third dielectric layer and the first dielectric layer are etched until the underlying surface of the second dielectric layer and of the substrate, respectively, is uncovered. After this etching, the contact holes and the line trenches are completed.

The metallization plane is completed by the formation of contacts and lines in the contact holes and the line trenches.

Since, in the method, the surface of the first dielectric layer and third dielectric layer are uncovered essentially simultaneously during the etching using the second etching mask, the first dielectric layer and the third dielectric layer can be formed from silicon nitride and the second dielectric layer and the fourth dielectric layer can be formed from $SiO_2$, without the selectivity of the etching of $SiO_2$ with regard to $Si_3N_4$ being adversely affected in the manner known from the literature. Therefore, the widths and heights of the line trenches and of the contact holes can be reliably controlled. Since the third dielectric layer is not uncovered prematurely, widening and beveling of the contact holes are avoided. The bottoms of the line trenches are smooth. A further advantage is that in the case of the etching using the first etching mask, it is possible to employ a non-selective etching method which can be optimized with regard to the speed of etching removal. In other words, a fast inexpensive etching method with a high etching rate can be employed in the case of the etching using the first etching mask, since etching selectivity is not necessary in this case.

In the method, firstly line trenches and contact holes are produced, in which contacts and lines of the metallization plane are subsequently formed. It is thus suitable for the fabrication of metallization planes from metals that are difficult to etch according to a damascene technique or dual damascene technique.

It lies within the scope of the invention for the first dielectric layer and the third dielectric layer, and the second dielectric layer and the fourth dielectric layer, in each case to be provided with essentially the same material composition. In particular, the first dielectric layer and the third dielectric layer are formed from an $Si_3N_4$-containing material and the second dielectric layer and the fourth dielectric layer are formed from an $SiO_2$-containing material. Furthermore, for the first dielectric layer and the third dielectric layer, which act as an etching stop, the following materials are also suitable: SiON, amorphous silicon, polysilicon, SiC, $Al_2O_3$. For the second dielectric layer and the fourth dielectric layer, in which the greatest part of the contact holes and of the line trenches are arranged, the following materials are furthermore suitable: $SiO_2$, BPSG, SOG, flare, BCB, silk, HSQ, FSG, nanoglass, parylene, PTFE, xerogels, aerogels.

Preferably, the first dielectric layer and the third dielectric layer have essentially the same thickness. In this case, during the etching of the first dielectric layer and of the third dielectric layer the surface of the substrate is prevented from being uncovered prematurely. This prevents contamination of the side walls of the contact holes and/or line trenches by material which is present in the surface of the substrate and is removed due to premature uncovering in the sense of overetching. The method is therefore particularly suitable for fabricating a metallization plane which extends to copper-containing contacts or lines.

Any substrate which is appropriate as a support for a metallization plane is suitable as the substrate. In particular, a semiconductor wafer containing an integrated circuit is suitable as the substrate. In this case, the contacts to be fabricated may extend both to a metallization plane already situated above the integrated circuit and to the surface of active components of the integrated circuit. The contacts may extend both to lines, contacts, diffusion regions such as, for example, source/drain regions, base regions, emitter regions, collector regions, and to doped regions of a solar cell or of a diode or terminals such as, for example, gate electrodes, source/drain terminals, or the like. An integrated circuit realized using thin-film technology or an insulating support is also suitable as the substrate. In this case, the integrated circuit may be produced either before or else after the fabrication of the metallization plane.

An exemplary embodiment of the invention is explained in more detail below with reference to figures.

An object and advantage of the invention is to provide a

The foregoing objects and advantages of the invention will become apparent to those skilled in the art when the following detailed description of the invention is read in conjunction with the accompanying drawings and claims. Throughout the drawings, like numerals refer to similar or identical parts.

DETAILED DESCRIPTION OF THE INVENTION

Figure 1:
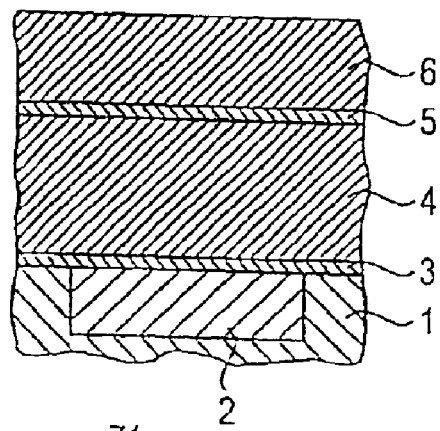
FIG. 1 shows a section through a substrate on which a first dielectric layer, a second dielectric layer, a third dielectric layer and a fourth dielectric layer are arranged.

With reference to the accompanying Figures, which provide one embodiment of the invention, there is provided a first dielectric layer 3, a second dielectric layer 4, a third dielectric layer 5 and a fourth dielectric layer 6 are applied to a substrate 1 having a conductive structure 2 (see FIG. 1). The substrate 1 is a monocrystalline silicon wafer in which an integrated circuit (not specifically shown) is realized. The surface of the substrate 1 is formed by a dielectric passivation layer in which the conductive structure 2 is arranged. The conductive structure 2 is a copper line.

The first dielectric layer 3 is formed from $Si_3N_4$ to a layer thickness of 50 nm by deposition in a plasma CVD process. The second dielectric layer 4 is formed from $SiO_2$ to a layer thickness of 850 nm by deposition in a plasma CVD method. The third dielectric layer 5 is formed from $Si_3N_4$ to a layer thickness of 50 nm by deposition in a plasma CVD method. The fourth dielectric layer 6 is formed from $SiO_2$ to a layer thickness of 600 nm by deposition in a plasma CVD method.

Figure 2:
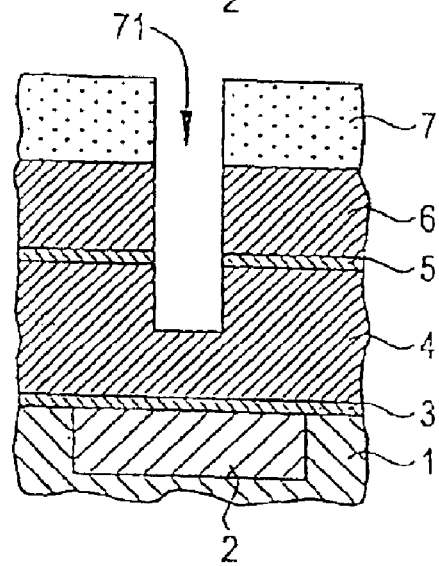
FIG. 2 shows the section through the substrate after the formation of a first etching mask and etching down into the second dielectric layer.

A first etching mask 7 made of photoresist is formed on the surface of the fourth dielectric layer 6 (see FIG. 2). The first etching mask 7 defines the arrangement of contact holes. In a non-selective—that is to say with not very different etching rates for the dielectric films; in the best case SiO$_2$/SiN selectivity=1:1—RIE process with a high etching rate using CHF$_3$ and CF$_4$ as process gas, etching is effected through the fourth dielectric layer 6 and the third dielectric layer 5 into the second dielectric layer 4. The etching process used has essentially the same etching rates for SiO$_2$ and Si$_3$N$_4$. The etching is controlled over time. The etching is ended as soon as the remaining thickness of the third dielectric layer is essentially equal to the thickness of the fourth dielectric layer 6, that is to say 600 nm.

The first etching mask 7 is subsequently removed by incineration and/or wet-chemically using EKC 525 (that is wet-chemical polymer removal).

Figure 3:
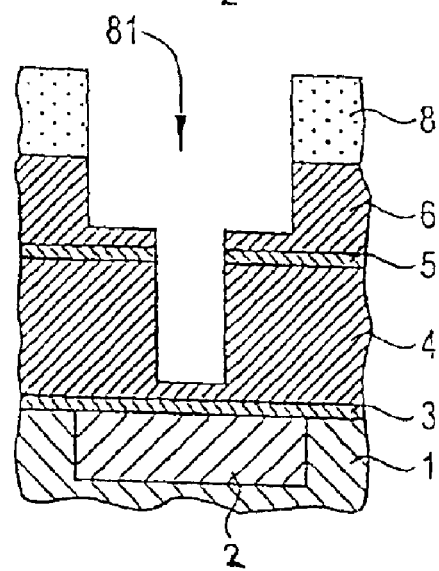
FIG. 3 shows a section through the substrate after the formation of a second etching mask after partial etching.

A second etching mask 8 is subsequently produced, which defines the arrangement of line trenches (see FIG. 3). In an RIE process with a high etching rate, etching is subsequently effected into the uncovered parts of the fourth dielectric layer 6 and of the second dielectric layer 4. The etching is controlled by way of the etching time. It is ended before the surface of the third dielectric layer 5 and of the first dielectric layer 3, respectively, is uncovered. The etching is likewise effected using CHF$_3$ and CF$_4$. The residual thickness of the second dielectric layer 4 and of the fourth dielectric layer is from 50 to 100 nm.

Figure 4:
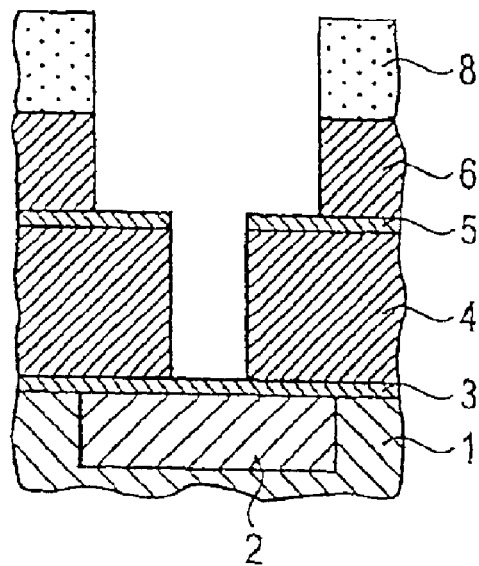
FIG. 4 shows a section through the substrate after selective etching of the fourth dielectric layer and second dielectric layer.

Selective etching is then effected in an RIE process using C$_4$F$_8$ and CO, with or without O$_2$ (both are possible) as process gas. A high selectivity in the etching of SiO$_2$ with respect to Si$_3$N$_4$ is obtained in this case. The etching is continued until the surface of the first dielectric layer 3 and of the third dielectric layer 5 is uncovered. Over etching is not necessary since the surface of the first dielectric layer 3 and of the third dielectric layer 5 are uncovered essentially simultaneously (see FIG. 4). After the removal of the second etching mask by incineration and wet-chemical polymer removal using EKC 525, the uncovered parts of the first dielectric layer 3 and of the third dielectric layer 5 are removed. The etching is effected in an RIE process using CF$_4$ and Ar with a low RF power of 250 W and a diameter of the substrate wafer of 6'. After this etching, the contact holes and the line trenches are completed.

Figure 5:
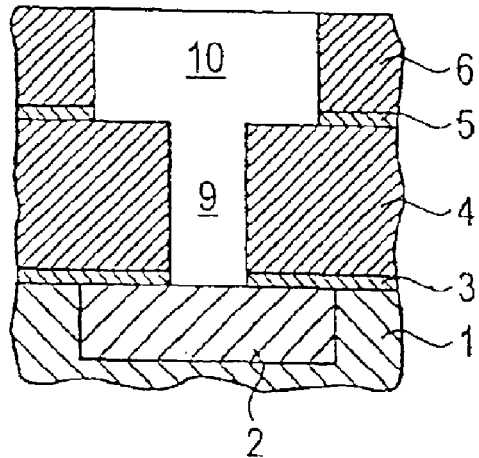
FIG. 5 shows a section through the substrate after the etching of the third dielectric layer and of the first dielectric layer and the formation of contacts and lines.

In order to complete contacts 9 and lines 10, a conformal diffusion barrier layer is subsequently applied by sputtering, said layer being composed of a TaN layer having a thickness of 10 nm and a Ta layer having a thickness of 40 nm. A copper seed layer is subsequently sputtered on. The contact holes and line trenches are filled by electroplating with copper. Parts of the copper and of the diffusion barrier layer which project beyond the line trenches are removed by chemical mechanical polishing (CMP). The method is ended by cleaning the substrate on both sides using a brush cleaner. The structure illustrated in FIG. 5 is produced, with a metallization plane comprising the contacts 9 and the lines 10.

The above specification describes certain preferred embodiments of this invention. This specification is in no way intended to limit the scope of the claims. Other modifications, alterations, or substitutions may now suggest themselves to those skilled in the art, all of which are within the spirit and scope of the present invention. It is therefore intended that the present invention be limited only by the scope of the attached claims below.

What is claimed is:

1. A method for fabricating an integrated circuit having at least one metallization plane, comprising applying a first dielectric layer, a second dielectric layer, a third dielectric layer and a fourth dielectric layer to a surface of a substrate, in each case the first dielectric layer and the third dielectric layer, and the second dielectric layer and the fourth dielectric layer having the same etching properties and the thickness of the second dielectric layer differing from the thickness of the fourth dielectric layer, using a first etching mask, which defines the arrangement of contact holes, if the thickness of the second dielectric layer is greater than the thickness of the fourth dielectric layer, etching is effected through the fourth dielectric layer and the third dielectric layer into the second dielectric layer thereby forming a hole, wherein a distance between the bottom of the hole and the upper face of the first layer is essentially equal to the thickness of the fourth dielectric layer, and, if the thickness of the fourth dielectric layer is greater than the thickness of the second dielectric layer, etching is effected into the fourth dielectric layer thereby forming a hole, wherein a distance between the bottom of the hole and the upper face of the first layer is essentially equal to the thickness of the second dielectric layer, using a second etching mask, which defines the arrangement of line trenches, firstly a non-selective etching process is carried out, by means of which etching is effected into the fourth dielectric layer and the second dielectric layer without the surface of the underlying third dielectric layer and first dielectric layer being uncovered, and then the fourth dielectric layer and the second dielectric layer are etched selectively with respect to the third dielectric layer and selectively with respect to the first dielectric layer until the underlying surfaces of the first and of the third dielectric layer are uncovered in each case, etching the third dielectric layer and the first dielectric layer until the underlying surface is uncovered in each case, producing metal-containing contacts and lines of the metallization plane in the contact holes and in the line trenches.

2. The method of claim 1, further comprising the etching of the fourth dielectric layer, of the third dielectric layer and of the second dielectric layer using the first etching mask with the aid of a non-selective etching process.

3. The method of claim 1, further comprising the first dielectric layer and the third dielectric layer, and the second dielectric layer and the fourth dielectric layer, having essentially the same material composition.

4. The method of claim 2, further comprising the first dielectric layer and the third dielectric layer, and the second dielectric layer and the fourth dielectric layer, having essentially the same material composition.

5. The method of claim 3, wherein the first dielectric layer and the third dielectric layer contain Si$_3$N$_4$ and the second dielectric layer and the fourth dielectric layer contain SiO$_2$.

6. The method of claim 1, in which the first dielectric layer and the third dielectric layer have essentially the same thickness.

7. The method of claim 1, in which the contacts and interconnects are formed by the deposition and planarization of metal.

8. The method of claim 1, in which the contacts and interconnects contain copper.

9. The method of claim 1, in which the contacts contain copper.

10. The method of claim 1, in which the interconnects contain copper.

* * * * *